United States Patent
Wieting et al.

(10) Patent No.: US 8,142,521 B2
(45) Date of Patent: Mar. 27, 2012

(54) LARGE SCALE MOCVD SYSTEM FOR THIN FILM PHOTOVOLTAIC DEVICES

(75) Inventors: Robert D. Wieting, Simi Valley, CA (US); Kenneth B. Doering, San Jose, CA (US); Jurg Schmitzburger, San Jose, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 13/049,114

(22) Filed: Mar. 16, 2011

(65) Prior Publication Data
US 2011/0230006 A1 Sep. 22, 2011

Related U.S. Application Data

(60) Provisional application No. 61/318,750, filed on Mar. 29, 2010.

(51) Int. Cl.
H01L 21/00 (2006.01)
(52) U.S. Cl. ............ 29/25.02; 118/724; 219/121.43; 438/73
(58) Field of Classification Search ......... 29/25.01, 29/25.02; 118/715, 719, 724, 725, 728; 219/121.43, 219/121.51, 121.4; 438/75
See application file for complete search history.

(56) References Cited

U.S. PATENT DOCUMENTS

| | | | |
|---|---|---|---|
| 4,204,933 A | 5/1980 | Barlow et al. |
| 4,213,781 A | 7/1980 | Noreika et al. |
| 4,239,553 A | 12/1980 | Barnett et al. |
| 4,347,436 A | 8/1982 | Fukuda et al. |
| 4,502,225 A | 3/1985 | Lin |
| 4,611,091 A | 9/1986 | Choudary et al. |
| 4,612,411 A | 9/1986 | Wieting et al. |
| 4,873,118 A | 10/1989 | Elias et al. |
| 4,915,745 A | 4/1990 | Pollock et al. |
| 4,996,108 A | 2/1991 | Divigalpitiya et al. |
| 5,125,984 A | 6/1992 | Kruehler et al. |
| 5,261,968 A | 11/1993 | Jordan |
| 5,421,909 A | 6/1995 | Ishikawa et al. |
| 5,482,571 A | 1/1996 | Yamada et al. |
| 5,501,744 A | 3/1996 | Albright et al. |
| 5,536,333 A | 7/1996 | Foote et al. |
| 5,578,103 A | 11/1996 | Araujo et al. |
| 5,589,006 A | 12/1996 | Itoyama et al. |
| 5,622,634 A | 4/1997 | Noma et al. |
| 5,626,688 A | 5/1997 | Probst et al. |

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

(Continued)

Primary Examiner — Julio J Maldonado
(74) Attorney, Agent, or Firm — Kilpatrick Townsend & Stockton LLP

(57) ABSTRACT

An apparatus for fabricating thin films on substrate panels includes a deposition chamber enclosed by sidewalls, a lid, and a base. The apparatus includes a mixing chamber disposed above the lid and configured to receive vapor species and form a mixed vapor. The mixing chamber is coupled with the deposition chamber via inlets through the lid, including a diffuser plate. Two heater plates disposed side by side on the base supporting and heating two substrates.

14 Claims, 15 Drawing Sheets

U.S. PATENT DOCUMENTS

| | | | |
|---|---|---|---|
| 5,665,175 | A | 9/1997 | Safir |
| 5,834,730 | A * | 11/1998 | Suzuki et al. ............ 219/121.43 |
| 5,855,974 | A | 1/1999 | Wu et al. |
| 5,948,176 | A | 9/1999 | Ramanathan et al. |
| 5,985,691 | A | 11/1999 | Basol et al. |
| 6,001,744 | A | 12/1999 | Doi |
| 6,077,722 | A | 6/2000 | Jansen et al. |
| 6,134,049 | A | 10/2000 | Spiller et al. |
| 6,169,246 | B1 | 1/2001 | Wu et al. |
| 6,258,620 | B1 | 7/2001 | Morel et al. |
| 6,288,325 | B1 | 9/2001 | Jansen et al. |
| 6,310,281 | B1 | 10/2001 | Wendt et al. |
| 6,328,871 | B1 | 12/2001 | Ding et al. |
| 6,335,479 | B1 | 1/2002 | Yamada et al. |
| 6,361,718 | B1 | 3/2002 | Shinmo et al. |
| 6,380,480 | B1 | 4/2002 | Norimatsu et al. |
| 6,423,565 | B1 | 7/2002 | Barth et al. |
| 6,537,845 | B1 | 3/2003 | McCandless et al. |
| 6,632,113 | B1 | 10/2003 | Noma et al. |
| 6,635,307 | B2 | 10/2003 | Huang et al. |
| 7,179,677 | B2 | 2/2007 | Ramanathan et al. |
| 7,220,321 | B2 | 5/2007 | Barth et al. |
| 7,235,736 | B1 | 6/2007 | Buller et al. |
| 7,252,923 | B2 | 8/2007 | Kobayashi |
| 7,303,788 | B2 | 12/2007 | Kataoka et al. |
| 7,319,190 | B2 | 1/2008 | Tuttle |
| 7,364,808 | B2 | 4/2008 | Sato et al. |
| 7,544,884 | B2 | 6/2009 | Hollars |
| 7,576,017 | B2 | 8/2009 | Tuttle |
| 7,736,755 | B2 | 6/2010 | Igarashi et al. |
| 7,741,560 | B2 | 6/2010 | Yonezawa |
| 7,846,750 | B2 | 12/2010 | Boyer |
| 7,863,518 | B2 | 1/2011 | Terakawa et al. |
| 7,875,945 | B2 | 1/2011 | Krasnov et al. |
| 2002/0004302 | A1 | 1/2002 | Fukumoto et al. |
| 2002/0061361 | A1 | 5/2002 | Nakahara et al. |
| 2004/0191949 | A1 | 9/2004 | Iwata et al. |
| 2004/0191950 | A1 | 9/2004 | Nakamura et al. |
| 2005/0109392 | A1 | 5/2005 | Hollars |
| 2005/0223570 | A1 | 10/2005 | Yonezawa et al. |
| 2006/0219288 | A1 | 10/2006 | Tuttle |
| 2006/0220059 | A1 | 10/2006 | Satoh et al. |
| 2007/0004078 | A1 | 1/2007 | Alberts |
| 2007/0089782 | A1 | 4/2007 | Scheuten et al. |
| 2007/0116892 | A1 | 5/2007 | Zwaap et al. |
| 2007/0151596 | A1 | 7/2007 | Nasuno et al. |
| 2007/0169810 | A1 | 7/2007 | Van Duren et al. |
| 2007/0209700 | A1 | 9/2007 | Yonezawa et al. |
| 2007/0243657 | A1 | 10/2007 | Basol et al. |
| 2008/0041446 | A1 | 2/2008 | Wu et al. |
| 2008/0092945 | A1 | 4/2008 | Munteanu et al. |
| 2008/0092953 | A1 | 4/2008 | Lee |
| 2008/0110491 | A1 | 5/2008 | Buller et al. |
| 2008/0115827 | A1 | 5/2008 | Woods et al. |
| 2008/0121277 | A1 | 5/2008 | Robinson et al. |
| 2008/0210303 | A1 | 9/2008 | Lu et al. |
| 2008/0216886 | A1 | 9/2008 | Iwakura |
| 2009/0021157 | A1 | 1/2009 | Kim et al. |
| 2009/0084438 | A1 | 4/2009 | den Boer et al. |
| 2009/0087942 | A1 | 4/2009 | Meyers |
| 2009/0145746 | A1 | 6/2009 | Hollars |
| 2009/0235983 | A1 | 9/2009 | Girt et al. |
| 2009/0235987 | A1 | 9/2009 | Akhtar et al. |
| 2009/0293945 | A1 | 12/2009 | Peter |
| 2010/0087016 | A1 | 4/2010 | Britt et al. |
| 2010/0087026 | A1 | 4/2010 | Winkeler et al. |
| 2010/0087027 | A1 | 4/2010 | Wieting |
| 2010/0096007 | A1 | 4/2010 | Mattmann et al. |
| 2010/0101648 | A1 | 4/2010 | Morooka et al. |
| 2010/0101649 | A1 | 4/2010 | Huignard et al. |
| 2010/0224247 | A1 | 9/2010 | Bartholomeusz et al. |
| 2010/0267189 | A1 | 10/2010 | Yu et al. |
| 2010/0297798 | A1 | 11/2010 | Adriani et al. |

OTHER PUBLICATIONS

Gordillo et al. "Electrical and morphological properties of low resistivity Mo thin films prepared by magnetron sputtering," 9Brazilian Journal of Physics 36:982-985 (Sep. 2006).

Grecu et al. "Spectroscopic Characterization of Chemical Bath Deposited Cadmium Sulphide Layers", Journal of Optoelectronics and Advanced Matenals 6:127-132 (Mar. 2004).

Onuma et al., Preparation and Characterization of CuInS Thin Films Solar Cells with Large Grain, Elsevier Science B.V; Solar Energy Materials & Solar Cells 69 (2001) pp. 261-269.

Palm et al. "Second generation CIS solar modules," Solar Energy 77:757-765 (Dec. 2004).

Scofield "Sodium diffusion, selenization, and microstructural effects associated with various molybdenum back contact layers for CIS-based solar cells", Proceedings of the 24th IEEE Photovoltaic Specialists Conference, pp. 164-167 (1995).

* cited by examiner

SECTION A-A

LARGE SCALE MOCVD SYSTEM FOR THIN FILM PHOTOVOLTAIC DEVICES

CROSS-REFERENCE TO RELATED APPLICATIONS

This application claims priority to U.S. Provisional Application No. 61/318,750, filed Mar. 29, 2010, commonly assigned, and hereby incorporated by reference in its entirety herein for all purpose.

BACKGROUND OF THE INVENTION

This invention relates to photovoltaic techniques, and in particular to a large scale system and method for manufacturing thin film photovoltaic devices using copper indium diselenide species (CIS), copper indium gallium diselenide species (CIGS), as well as other materials. The invention can be applied to implement a Metal-Organic Chemical Vapor Deposition (MOCVD) system for depositing metal oxide materials for manufacturing thin film photovoltaic devices on large scale substrate panels.

In the process of manufacturing CIS and/or CIGS thin films, there are various manufacturing challenges, such as scaling up the manufacturing to large substrate panels while maintaining structure integrity of the substrate materials, ensuring uniformity and granularity of the thin film material, etc. While conventional techniques in the past have addressed some of these issues, they are often inadequate. Therefore, it is desirable to have improved systems and method for manufacturing thin film photovoltaic devices.

BRIEF SUMMARY OF THE INVENTION

This invention provides a method and a large scale system for chemical vapor deposition for fabricating thin-film photovoltaic devices based on copper indium diselenide species (CIS), copper indium gallium diselenide species (CIGS), and other materials. The invention can be applied to photovoltaic modules, flexible sheets, building or window glass, automotive glass, and other materials.

This invention provides an apparatus for fabricating thin film photovoltaic devices on substrate panels. The apparatus includes a deposition chamber enclosed by a plurality of sidewalls, a lid member structure, and a base member structure. The deposition chamber is supported by a support member structure. The apparatus further includes a mixing chamber disposed above the lid member structure and configured to receive two or more vapor species and form a mixed vapor. The mixing chamber is coupled with the deposition chamber via one or more inlets through the lid member structure. Additionally, the apparatus includes two heater plates disposed side-by-side and supported on the base member structure for respectively supporting and heating two substrate panels each having substantially the same geometric shape and surface area as each heater plate. Furthermore, the apparatus includes a lifting structure disposed under the deposition chamber and configured to lift the two substrate panels to a predetermined position inside the deposition chamber by using a plurality of pins to pass through both the base member structure and each of the two heater plates. Moreover, the apparatus includes a valve stack coupled to the deposition chamber via an exit port located below the two heater plates in a central region of the base member structure. The valve stack communicates the deposition chamber with a pumping module through a vacuum foreline.

In another specific embodiment, the deposition chamber includes an interior shield structure assembled from a first part attached to cover the plurality of sidewalls, a second part curtained around an outer peripheral edge of the two heater plates to cover side regions between the two heater plate and the base member structure, a third part to cover a middle gap between the two heater plates, and a fourth part disposed below the two heater plates and above the base member structure to cover a bottom face of the two heater plates. Moreover, the second part of the interior shield structure includes a plurality of holes for guiding a downstream flow of the mixed vapor over peripheral edges of the two substrate panels to pass through into a space below the fourth part before being removed by the pump module via the exit port.

In an alternative embodiment, the invention provides a system for manufacturing thin film photovoltaic devices on substrate panels using chemical vapor deposition. The system includes a precursor subsystem for producing one or more vapors. The precursor subsystem further includes a first delivery module to supply a first liquid, a second delivery module to supply a second liquid, and a third delivery module to supply a gaseous species. Furthermore, the subsystem includes a bubbler control module including a first bubbler and a second bubbler respectively configured to convert the first liquid to a first vapor and convert the second liquid to a second vapor, and a metering valve for controlling a merge of the gaseous species with the second vapor to form a third vapor. Additionally, the system includes a process subsystem including a mixing chamber and a deposition chamber. The mixing chamber is coupled to the bubbler control module to receive the first vapor and the third vapor and form a vapor precursor. The deposition chamber includes a lid member structure, four sidewalls, a door built in one of the four sidewalls, a base member structure, a heater plate supported on the base member structure for supporting and heating one or more shaped substrates, and an interior shield structure disposed at least to cover the four sidewalls and curtain around outer peripheral side regions between the heater plate and the base member structure. The lid member structure is coupled to the mixing chamber and configured to deliver the mixed precursor vapor downward into the deposition chamber over the one or more shaped substrates therein. The heater plates is configured to allow a plurality of lift pins to pass through the heating plate and lift the one or more shaped substrates. The interior shield structure having a plurality of gas flow channels around outer peripheral side regions between the heater plate and the base member structure. The system also includes a valve stack module coupled to the deposition chamber via an exit port located below the heater plate in a central region of the base member structure. The valve stack module includes a pipeline. Furthermore, the system includes a pump module connected to the pipeline. In a specific embodiment, the interior shield structure further includes an insulating plate disposed to cover a bottom face of the heater plate and form a cavity connected to the exit port in the base member structure, thereby causing a downstream flow of the mixed precursor vapor to pass through the plurality of gas flow channels into the cavity before being pumped out via the exit port.

In another embodiment, the present provides a method of using vapor deposition for the manufacture of thin film photovoltaic devices on substrate panels. The method includes providing a deposition chamber coupled to a mixing chamber for performing vapor deposition. The deposition chamber includes an upper lid member coupled to the mixing chamber, a lower base member connected with the upper lid member by a number of side members, a heater plate disposed below the upper lid member and configured to have its peripheral edges supported by a frame structure on the lower base member. The mixing chamber is configured to form a mixed precursor vapor. The plurality of feedthrough structures are respectively fed with a plurality of lifting pins configured to move vertically from a low position below the heater plate up to a high position above the heater plate. Additionally, the method includes disposing one or more substrate panels having a form factor as large as 165×65 cm firstly on top of the plurality of lifting pins at the high position then respectively on one or more surface regions of the heater plate as the plurality of lifting pins is lowered to the low position. The heater plate includes one or more embedded pipes respectively laid out under the one or more surface regions and supplied with a fluid from one or more heat sources for heating the one or more substrate panels to a predetermined temperature range substantially uniformly over entire substrate panel. The method further includes configuring the upper lid chamber with a shower-head distributer for releasing the mixed precursor vapor in a steady downward flow over the one or more substrate panels. The mixed precursor vapor partially is transformed to a solid film deposited on the one or more substrate panels and partially forms a down-stream flow flowing over the peripheral edges of the heater plate. Furthermore, the method includes disposing a removable shield structure inside the deposition chamber. The removable shield structure includes at least a first part to cover all the number of side members, a second part to cover a bottom face of the heater plate, and a third part to cover outer side regions of the heater plate above the lower base member. The third part includes a number of holes for at least partially guiding the downstream flow to pass into a space between the second part and the lower base member. Moreover, the method includes coupling a pump module to the deposition chamber via an exit port in a central region of the lower base member to remove at least partially the downstream flow in the space below the heater plate and maintain a predetermined pressure range in the deposition chamber.

It is to be appreciated that the invention provides numerous benefits over conventional techniques. Among other things, the systems and processes of the present invention are compatible, but scaled from conventional systems, which allow cost effective implementation of conventional chemical vapor deposition into applications for depositing thin films substantially uniformly on large surface area of glass substrates with various dimensions up to 165 cm. In various embodiments, the apparatus and structures associated with the chemical liquid delivery, doping gas delivery, and vapor generation, vapor mixing to form precursor, precursor vapor delivery, temperature control for both precursor and substrate, and the large sized substrate handling with structure integrity have been disclosed to provide various advantages over the conventional techniques. In one or more embodiments, the precursor vapor delivery is implemented in a lid member configured to distribute the vapor substantially uniform and steady in a downward flow over the substrate surface. The deposition chamber is added an interior shield structure configured to cover almost all interior surfaces except a number of channels in a frame structure around all outer side regions of the heater plates above a base member. The channels guide the downward-flow vapor that flows laterally across the surface of the substrates and over the outer side regions. The downstream flow further is guided to pass through the shield structure towards an exit port built below the heater plates in a central region of the base member structure, where the exit port is coupled to a pump module via a valve stack to remove the vapor residue. This flow pattern substantially enhances the uniformity of the deposited film on the substrates with large form factor of 165×65 cm or the like. For example, high quality and low cost large scale manufacture of thin film photovoltaic panels directly on extra large glass substrates are achieved with overall efficiency over 11%. There are other benefits as well.

DETAILED DESCRIPTION OF THE INVENTION

Figure 1:
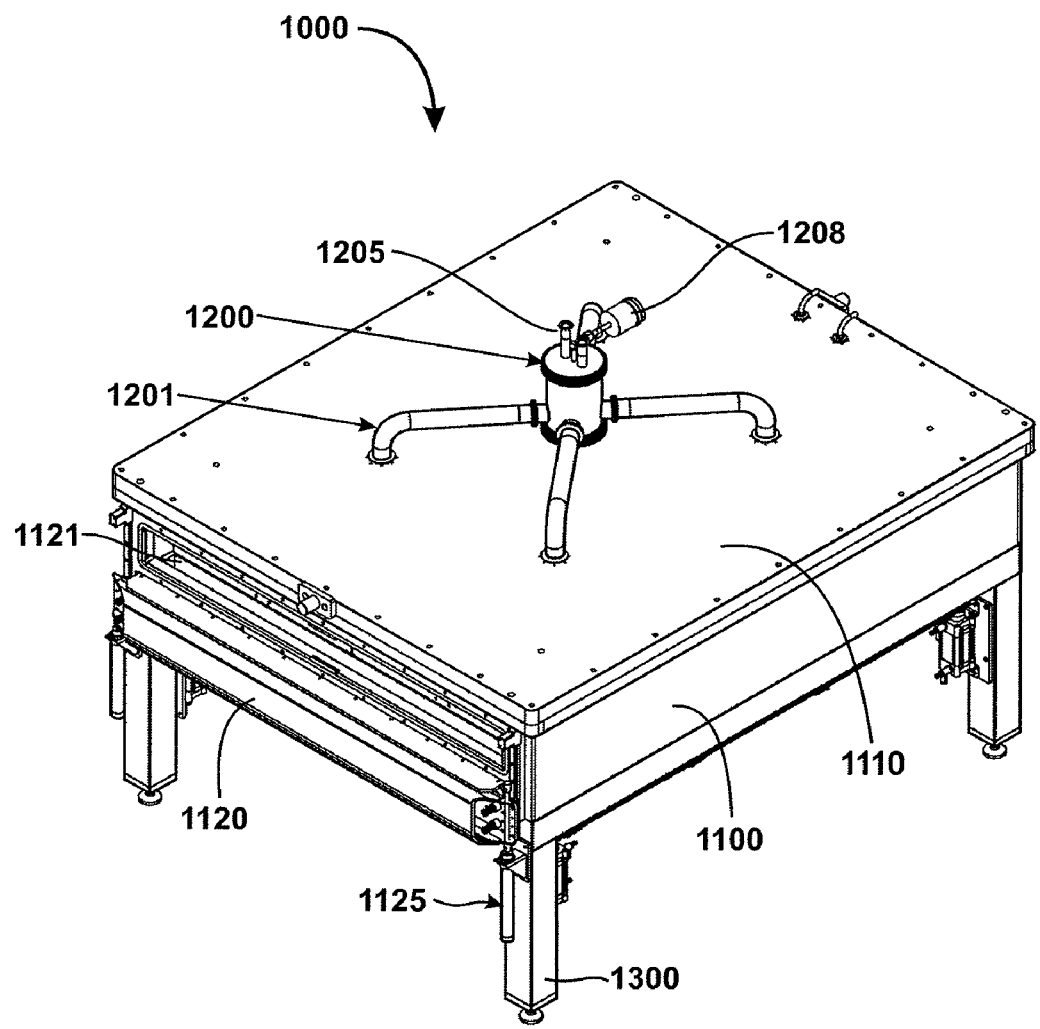
FIG. 1 is a perspective view of a metal-organic chemical vapor deposition process chamber.

FIG. 1 is a perspective view of a metal-organic chemical vapor deposition process chamber according to an embodiment of the present invention. As shown, a process chamber 1000 is provided for fabricating thin film photovoltaic devices on substrate panels using chemical vapor deposition technique, although it can be applied for many other devices on substrate panels with large form factors. The process chamber 1000 includes a deposition chamber 1100 and a mixing chamber 1200. The mixing chamber 1200 is configured to mix several gases to form a mixed gas or vapor material required for performing vapor deposition in the deposition chamber 1100. The mixing chamber 1200 is disposed above the deposition chamber 1100, coupling each other via several pipes 1201. The deposition chamber 1100 has a substantially rectangular shape and is supported at its four corners by a support member 1300. The chamber is designed to have a sufficiently large lateral dimension capable of holding one or more large substrates. More detail interior structure of the deposition chamber 1100 will be described in later sections. In an embodiment, the mixing chamber 1200 includes two or more gas inlets 1205 for receiving predetermined gas or vapor chemicals and forming a mixed vapor material therein. A gauge device 1208 is attached with the mixing chamber 1200 to monitor the pressure of the mixed vapor material, which is to be delivered to the deposition chamber 1100 via several outlet pipes 1201. In a specific embodiment, there are four such outlet pipes 1201 coupled between the mixing chamber 1200 and the deposition chamber 1100, which serve as gas inlets for the deposition chamber 1100. Each of the gas inlets 1201 (associated with the deposition chamber) is inserted through a lid member structure 1110 to deliver the mixed vapor material into the deposition chamber 1100 at a predetermined location intended for depositing substantially more uniformly on one or more substrates disposed therein.

In a specific embodiment, the processing chamber is for fabricating thin film photovoltaic devices using chemical vapor deposition technique, where the thin film photovoltaic devices are formed on large glass substrate panels. The deposition chamber 1100 is made of welded aluminum frames having four sidewalls or side member structures. At least one sidewall is configured to a vacuum flanged door 1120. The door 1120 can be controlled by one or more mechanical actuators 1125. In an embodiment, the mechanical actuators 1125 are airflow actuators. By adjusting flow rates of high-pressured air, the actuators 1125 are capable to let the door 1120 slide up and down to close or open the door. In an open position, door opening 1121 is revealed with a long length and a narrow width. In a close position, the door sealed the door opening to keep the chamber in vacuum condition. When the door 1120 is opened, substrate panels can be loaded/unloaded in/out of the deposition chamber 1110. Therefore, the length of the door opening 1121 is at least wider than the combined width of one or more substrates. In an implementation, a pair of glass substrate panels having a rectangular form factor of 65 cm×165 cm can be loaded in a side by side configuration into the deposition chamber 1100 through the door opening 1121.

Figure 2:
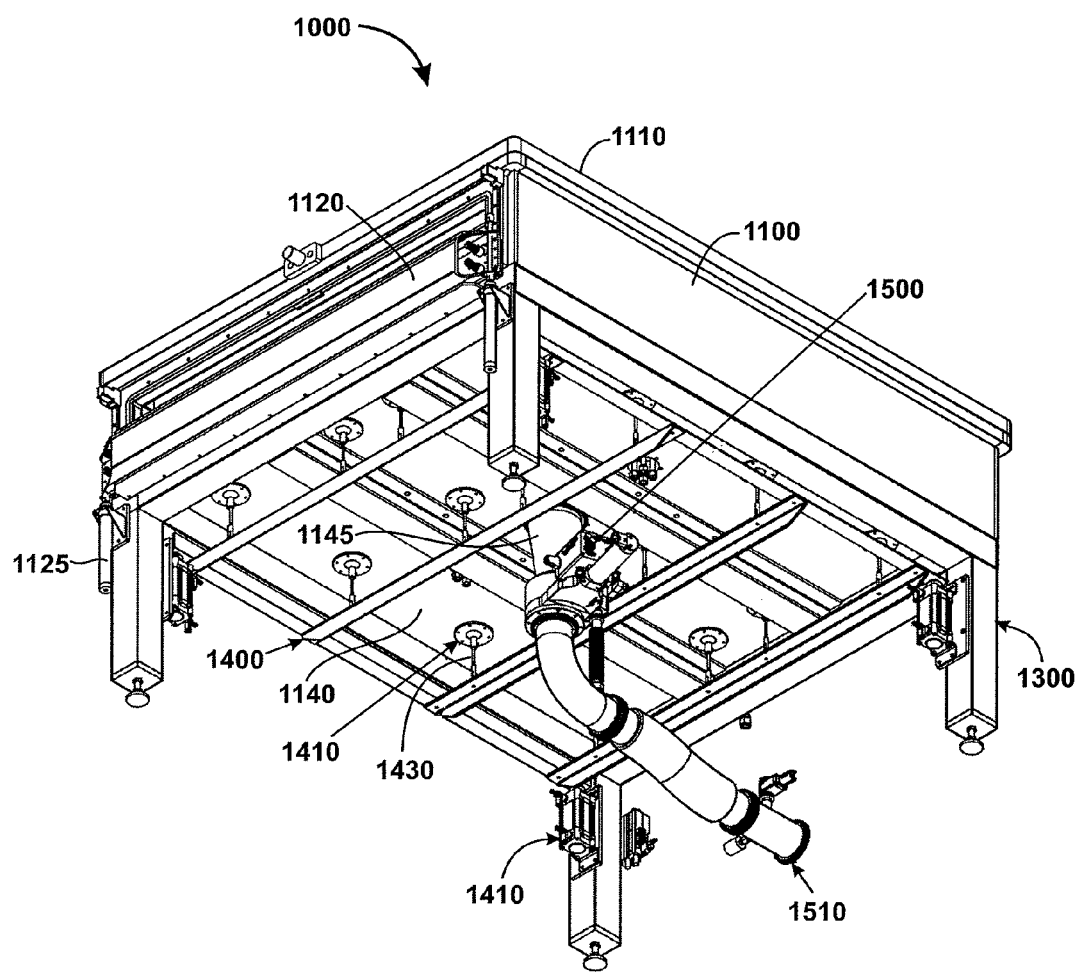
FIG. 2 is another perspective view of the metal-organic chemical vapor deposition process chamber.

FIG. 2 is another perspective view of the metal-organic chemical vapor deposition process chamber according to an embodiment of the present invention. This diagram is merely an example, which should not limit the scope of the claims herein. As shown, the underside of a base member structure 1140 of the process chamber 1000 is illustrated. Additionally, a lifting structure 1400 is directly coupled to the base member structure 1140 via a plurality of lift pins 1430. Each of the lift pins 1430 has its one end being attached to a member of the lifting structure and aligned to feed into a feedthrough 1420. The feedthrough 1420 is built with a vacuum sealed flange structure through the base member structure 1140 allowing the lift pin 1430 to completely penetrate through the base member structure 1140 into the vacuum chamber 1100. The lifting structure 1400 is lifted or suspended by pressured airflows from several actuators 1410. By separately and cohesively adjusting the airflow speed of each of four actuators 1410 attached with the four support members 1300, the whole lifting structure 1400 can be lowered or lifted up vertically. Accordingly, all lift pins 1430 are moved down or up in the feedthroughs 1420. Specifically, these lift pins 1430 can be raised up such that their open ends reach the bottom face of the loaded substrate (not visible here) and further lift the substrate inside the chamber 1100 up to a certain height. Because of the apparatus is designed to handle large sized substrate panel, multiple numbers of lift pins 1430 are used at several proper locations to provide secured lifting. In an example, eight lift pins 1430 are used for lifting one substrate in rectangular shape having a form factor of 65 cm×165 cm or greater size. More detail descriptions about supporting, lifting, and loading/unloading substrate panels can be found in sections below.

Referring to FIG. 2, the process chamber 1000 also includes a valve stack module 1500 disposed under the base member structure 1140. The valve stack module 1500 comprises multiple monitoring devices disposed via an exit port 1145 built in the base member structure for connecting a interior space of the deposition chamber 1100 to a pumping module (not shown). One end port of the valve stack module 1500 connects to the deposition chamber 1100 directly via a center flange fitted with the exit port 1145 at the base member structure 1140. At the same time, the other end port of the valve stack module 1500 is hooked with a vacuum foreline 1510 connecting to a pumping module (not shown). The valve stack module 1500 provides multi-stage pumping regulation, pressure control, leak checking and other functions.

Figure 3:
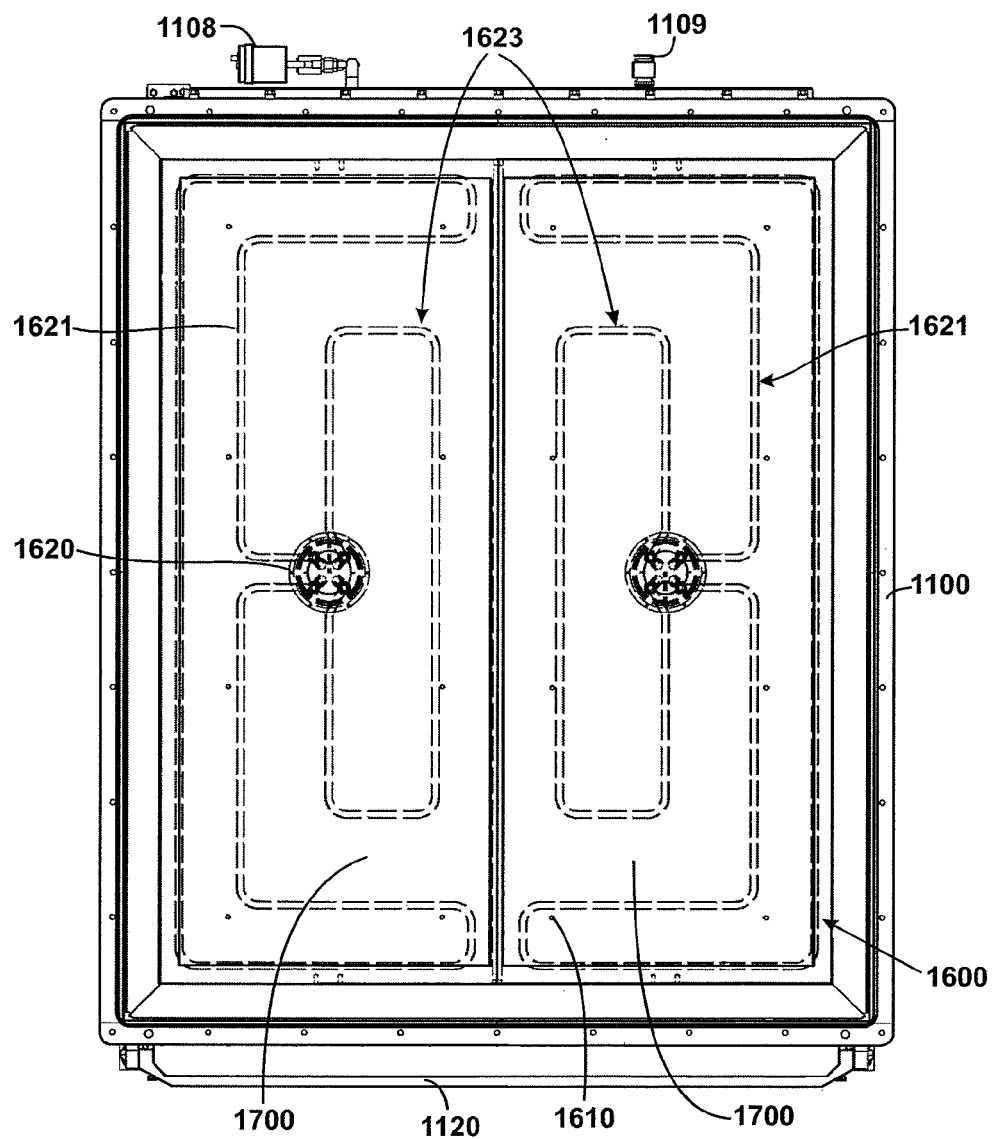
FIG. 3 is a top view of a substrate support plate disposed inside a deposition chamber.

FIG. 3 is a top view of a substrate support plate disposed inside a deposition chamber according to an embodiment of the present invention. This diagram is merely an example, which should not limit the scope of the claims herein. In an embodiment, the deposition chamber is designed for loading two or more rectangular shaped substrate panels. As shown, the deposition chamber 1100 includes one or more plates 1600 coupled to its base member structure 1140 for respectively supporting the shaped substrate panels. In a specific embodiment, the one or more plates 1600 are also heater plates for heating any substrate panels supported thereon. In an implementation, two heater plates 1600 in rectangular shape are disposed side-by-side (left-right in FIG. 3) and configured to respectively support two rectangular shaped substrate panels 1700. For example, each of the two substrate panels has a form factor of 165 cm×65 cm or greater. In an embodiment, each of the heater plates 1600 includes one or more heating elements for directly heating the substrate by conduction. The heating elements are embedded in the heater plate 1600, including a first heating pipe 1621 and a second heating pipe 1623 for each of the heater plates 1600. Both heating pipes 1621 and 1623 can be filled with a running liquid, e.g., silicon oil, to transfer thermal energy from a heat exchanger (not shown) to the heater plates 1600 and subsequently to the substrates themselves. In a specific embodiment, the first heating pipe 1621 runs its flow path mainly around an outer boundary regions of the heater plates 1600 while the second heating pipe 1623 runs its flow path substantially around the middle portion. When the two heater plates are disposed side by side, the corresponding first heating pipe 1621 and the second heating pipe 1623 are in a symmetric configuration across their boundary. In fact, the layout configuration of both heating pipes 1621 and 1623 embedded in each heater plate is designed based on the above symmetric two-plate position to provide substantially uniform heating to the respective substrate loaded on each heater plate. The running oil is independently supplied from the heat exchanger into the flow paths of the pipes 1621 and 1623 through a flow structure 1620 including an inlet and an outlet for each of the pipes 1621 and 1623. As shown in FIG. 3, the flow structure 1620 is located near a middle region of each of the heater plates 1600. With both heating pipes 1621 and 1623 properly distributed in respect layout configuration associated with each of the two heater plates 1600, two substrate panels 1700 loaded side-by-side on top of the corresponding two heater plates can be heated via thermal conduction and maintained with a substantially uniform temperature distribution across entire surface areas of the two substrate panels.

Also shown in FIG. 3, each of the two heater plates 1600 includes several through-holes 1610. These through-holes 1610 are aligned to let the corresponding lift pins 1430 to penetrate. In fact, it is intended to use these lift pins 1430 to release the loaded substrate 1700 from the heater plates 1600 and further lift the substrate up to a high position above a top face of the heater plates 1600 so that the substrate can be picked up by a loader arm. In an embodiment, for each heater plate 1600 there are eight such pin holes 1610 allowing eight lift pins 1430 to pass through respectively. FIG. 3 also shows a side door structure 1120 coupled to one sidewall of the deposition chamber 1100. In a specific embodiment, through this side door structure 1120 two rectangular substrate panels 1700 can be loaded in and out. Each of the two substrate panels 1700 firstly sit on the eight lift pins 1430, then rests directly on the top face of the heater plate 1600 as the lift pins are moved to a low position below the heater plate. On the opposite sidewall, a pressure gauge device 1108 and a leak check device 1109 are respectively coupled to the deposition chamber 1100.

Figure 4:
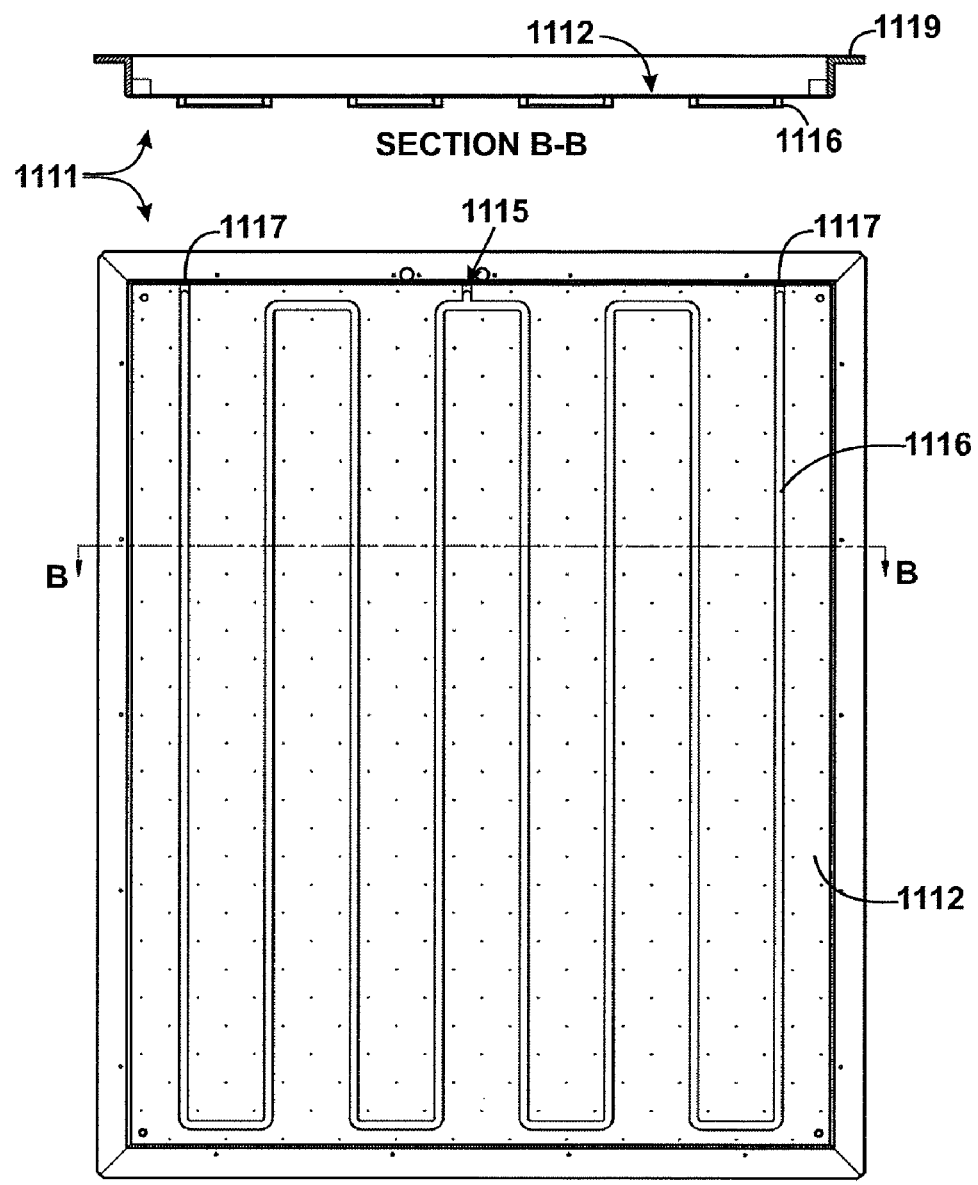
FIG. 4 is a bottom view and a section view (B-B) of a diffuser structure associated with a lid structure.

FIG. 4 is a bottom view and a section view (B-B) of a diffuser structure associated with a lid member structure according to an embodiment of the present invention. As shown, this diffuser structure 1111 has a shallow U-shaped cross section including a diffuser plate 1112 at the bottom and an edge support frame 1119 at its peripheral. When the diffuser structure 1111 is attached to the lid member structure (1110 shown in FIG. 1) it forms a cavity between an undersurface of the lid member structure 1110 and an inner face of the diffuser plate 1112. Gas or vapor material coming from the mixing chamber 1200 can stay within the cavity before being diffused further down to the deposition chamber 1100. The diffuser plate 1112 includes a thickness of about a quarter inches and a plurality of showerhead holes therein, similar like a showerhead, for distributing the mixed vapor material uniformly downward. In order to control the temperature of the mixed vapor material during passing through the plurality of showerhead holes, a cooling channel 1116 is attached to the face of the diffuser plate 1112 and running back and forth to cool the diffuser plate 1112 substantially uniformly. In a specific embodiment, the cooling channel 1116 uses water running through an inlet 1115 and out of two return exits 1117. The running water is controlled by a heat exchanger set outside the process chamber 1000. For maintenance convenience, the cooling channel 1116 is attached at an outer face of the diffuser plate 1112, although they can be attached to an inner face.

Figure 5:
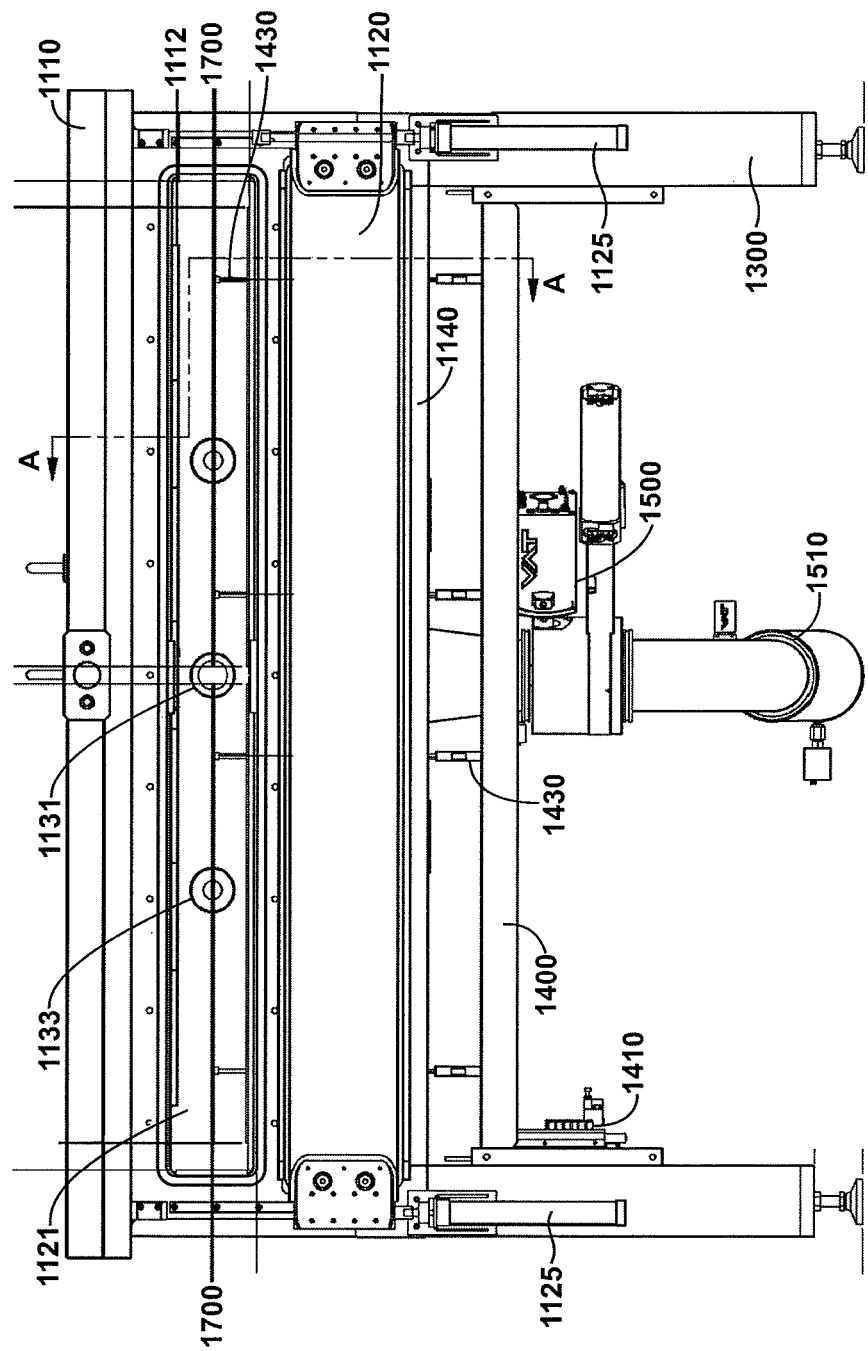
FIG. 5 is a side view of the deposition chamber.

FIG. 5 is a side view of the deposition chamber according to an embodiment of the present invention. This diagram is merely an example, which should not limit the scope of the claims herein. Further details of the deposition chamber 1100 shown in FIG. 1 viewed from an angle facing the side door structure 1120 are illustrated. As shown, the side door structure 1120 is in open status, lowered by the door actuators 1125. The door opening 1121 partially reveals inside of the deposition chamber 1100 including the backside wall. The side view also reveals multiple lift pins 1430 each with one end being attached to the lifting structure 1400 and being fed through the substrate heater plate 1600. The other ends of these lift pins 1430 are opened and used to lift the substrate panels 1700 as the pins are raised. As shown, two substrates 1700 are lifted up to a certain height, leaving a spatial clearance under the substrate panels 1700 for a substrate loader (not shown) to slide in and take the substrate panels 1700 out through the door opening 1121. In an implementation, the substrates 1700 can be lifted about 1.5 to 2 inches above the heater plate 1600. Through the door opening 1121, one can also see a view port 1131 and one or more monitor ports 1133 disposed on the back sidewall.

Figure 6:
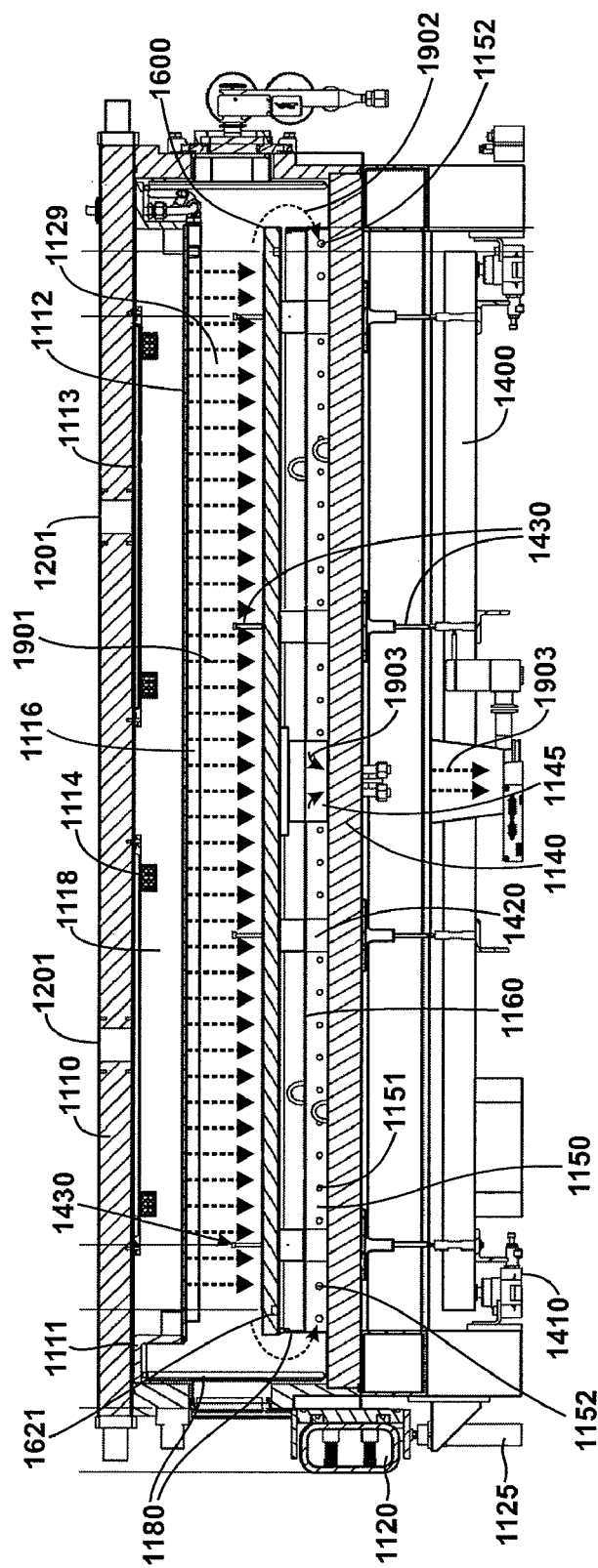
FIG. 6 is a section (A-A) view of the deposition chamber in FIG. 5.

FIG. 6 is a section (A-A) view of the deposition chamber in FIG. 5 according to an embodiment of the present invention. This diagram is merely an example, which should not limit the scope of the claims herein. As shown, a cross-section view of the lid member structure 1110 shows two gas inlets 1201 connected to the deposition chamber 1100 through the lid. The gas inlets 1201 communicate between the mixing chamber 1200 above (see FIG. 1) and the deposition chamber 1100 below. In a specific embodiment, there are four gas inlets 1201 built within the whole lid member structure 1110. The position of each gas inlet 1201 has been selected properly in order to provide substantially uniform vapor deposition over a wide area of the substrate. For example, a gas inlet is substantially above a center position of one half of a substrate panel in its loaded position inside the deposition chamber 1100. Additionally, below the gas inlet 1201, a distributor plate 1113 is attached for enhanced uniform delivery of the mixed vapor material for performing the vapor deposition. The distributor plate 1113 has a disk shape and a thin spatial region between its upper face and the under face of the lid frame to allow the incoming vapor material to spread laterally. The distributor plate 1113 includes four exit-holes disposed near a peripheral edge for further distribute the mixed vapor material downward. In an embodiment, each of the four exit-holes is configured to fit with an additional gas diffusing element 1114. The gas diffusing element 1114 has a sink-filter shape comprising a plurality of tiny holes around its body which extends beyond bottom face of the distributor plate 1113. Through the plurality of tiny holes the incoming gas or vapor is effectively distributed into a cavity 1118 formed by a shallow U-shaped diffuser structure 1111. In a specific embodiment, there are four such distributor plates 1113 respectively disposed under a gas inlet associated with the lid structure 1110. The cavity 1118 can hold a volume of gas between the four distributor plates 1311 and a diffuser plate 1112 positioned a spatial distance below the lid member body 1110 at a bottom of the shallow U-shaped diffuser structure 1111. The diffuser plate 1112 contains a plurality of small showerhead holes (not visible here) spreading the whole area thereof to allow the gas or vapor material further passing downward to deposit onto the substrates 1700 loaded below the diffuser plate.

FIG. 6 further shows additional details of the heater plate 1600 which couples to the base member structure 1140 of the deposition chamber 1100. Several lift pins 1430 are shown in their up position extended into a cavity 1129 above the heater plate 1600 through corresponding holes, provided that no substrate panel is loaded. This "up" position is near the middle of the cavity 1129 provided between the diffuser plate 1112 and the heater plate 1600 in the deposition chamber 1100. In an implementation, the "up" position is about 1.8 inches above the heater plate 1600, providing a spacing between a substrate (if loaded) lifted by these pins and the heater plate 1600. The spacing allows a substrate loader (not shown) to be inserted into the deposition chamber from the door opening 1121 (see FIG. 5) for loading or unloading the substrate.

The lift pins 1430 are fed within corresponding vacuum flanged feedthroughs 1420 built through the base member structure 1140 and the substrate support plate 1600. Each of the lift pins 1430 has one end fixedly coupled to a lifting frame structure 1400. In an embodiment, there are total 16 lift pins properly disposed so that two side-by-side loaded substrate panels with a large form factor of (w) 65 cm×(l) 165 cm can be respectively lifted by 8 lift pins. In the cross-section view shown in FIG. 6 only 4 such lift pins are visible. In another embodiment, the lifting process is realized by raising or lowering the lifting structure 1400 which is controlled by adjusting flow rates of the airflow actuators 1410 mounted to the chamber support member 1300. With proper adjustment of the air flow rates, the lifting structure 1400 can be raised or lowered with a predetermined displacement. Accordingly, the lift pins 1430 are raised a same displacement until the substrate panels (not shown in this figure) are lifted to a certain height within the cavity 1129. The substrate can be lowered till sitting on the heater plate 1600 when the lifting structure 1400 moves an enough distance down to let all the lift pins 1430 below the heater plate 1600.

FIG. 6 also shows how the two heater plates 1600 are coupled to the base member structure 1140 of the deposition chamber 1100. As shown, the vacuum feedthroughs 1420 not only pass through the base member structure 1140 but also have their bodies extended up a distance above the base member structure 1140. The two heater plates 1600 are configured to be directly supported by the bodies of those vacuum feedthroughs 1420, leaving a gap between the heater plates 1600 and the base member structure 1140 to allow a downstream flow. A flat shield member 1160 made by stainless steel can be added in the gap as a thermal insulator plate, respectively forming an upper and a lower spatial region. The poor thermal conductivity of the stainless steel and the upper and lower spatial region above and below the thermal insulator plate 1160 provide sufficient thermal insulation for keeping the two heater plates 1600 within a substantially stable temperature range. Therefore, any substrate panel supported by the heater plates 1600 is substantially under a stable thermal condition. As we described earlier, the heater plates 1600 includes embedded heating pipes 1621 which are also partially visible in this cross-sectional view.

In a specific embodiment, the deposition chamber 1100 further includes a removable shield structure 1180, as shown in FIG. 6, installed inside the deposition chamber for covering interior surfaces of the deposition chamber to avoid unwanted thin-film coating formed during the vapor deposition process. The advantages of using the removable shield structure lie in many aspects including a reduction of re-deposition of particles onto film on the substrate panels from the flakes built in the unwanted coating and reduction of chamber cleaning/maintenance cost. The interior surfaces that are preferred to be covered include all the sidewalls, the bottom face of the heater plates, a strip region in a middle gap between the two heater plates, and a peripheral side region around outer edges of the heater plates.

Figure 6A:
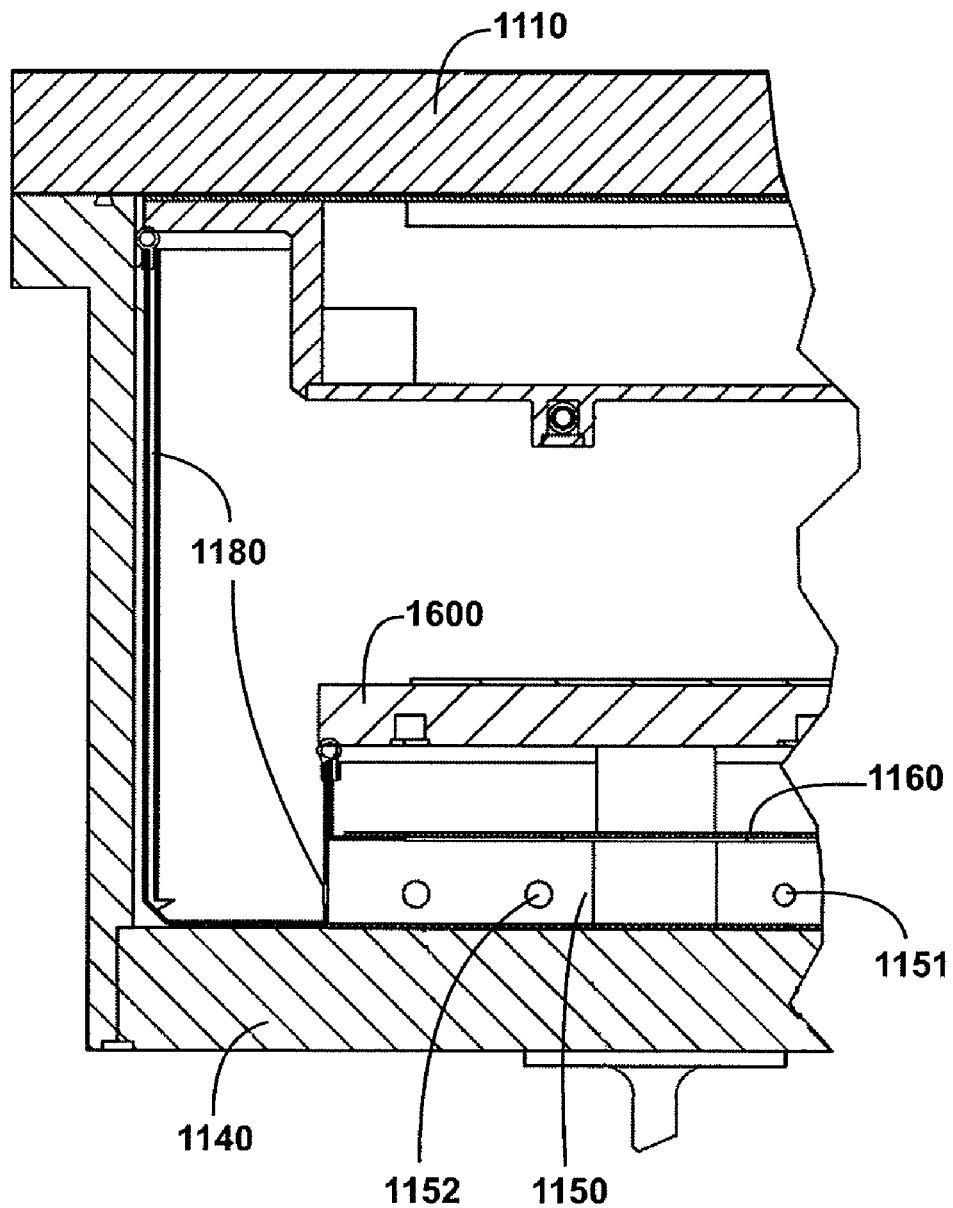
FIG. 6A is a section (A-A) view of an enlarged portion of the deposition chamber in FIG. 6.

In another specific embodiment, the removable shield structure 1180 for maintenance convenience can be assembled from several parts. For example, a first part can be attached to cover all sidewalls, as seen in FIG. 6. A second part can be curtained around outer peripheral side regions of the heater plates 1600 above the base member structure. A third part (not visible) may be disposed to cover the middle strip region of the two heater plates 1600. A fourth part can be just the flat shield structure 1160 disposed below the two heater plates 1600 and above the base member structure 1140. FIG. 6A further shows a detail look of a corner portion of FIG. 6, illustrating the removable shield structure 1180 installed to the sidewall and side region of the frame structure 1150. As shown, the second part of the removable shield structure has a leveled section used for supporting the fourth part (i.e., the flat insulating plate 1160) of the shield structure. Each assembly piece of the shield structure 1180 can be a sheet metal or thin plate made by stainless steel or aluminum.

In yet another specific embodiment, the second part of the removable shield structure 1180 includes multiple holes 1152 and 1151 located at a lower portion 1150 for connecting the outer side region of the second part shield structure to the lower spatial region between the flat shield member 1160 and the base member structure 1140. As seen in the cross-sectional view of FIG. 6 and FIG. 6A, the holes 1152 and 1151 allow a downstream flow to pass through the lower portion 1150 of the shield structure. In an embodiment, the mixed vapor material supplied from the mixing chamber 1200 is distributed via a plurality of showerhead holes of the distributer plate 1112 as a downward flow 1901 into the cavity 1129 of the deposition chamber 1100 over the loaded substrates on the heater plates 1600. The mixed vapor material partly is transformed into a solid film deposited overlying the substrates (which is heated by the heater plate 1600 to an elevated temperature to induce a reaction among the mixed vapor to form a solid species). Part of the mixed vapor material forms a downstream flow 1902 over the peripheral edge of the heater plates 1600 towards the side regions of second part of the shield structure. The plurality of holes or gas flow channels 1151 and 1152 thus guides the downstream flow 1902 to pass through the lower portion 1150 of shield structure into the lower spatial region between the flat insulation plate 1160 and the base member structure 1140. The lower spatial region is directly linked to the exit port 1145 built in a central region of the base member structure 1140, allowing all the downstream flow 1902 to be sucked as an exit flow 1903 by a pump module (not shown). A valve stack module 1500 (see also FIG. 2) is installed between the exit port 1145 and the pump module to control the exit flow 1903 and help to maintain a substantially steady chamber pressure within a predetermined range for performing the vapor deposition. The combined structural configuration of the chamber, heater plates, and the removable interior shield structure helps to induce a steady interior flow for the mixed vapor material. After being distributed as a substantially uniform downward flow 1901 from the showerhead distributer 1121, the mixed vapor material reaches to the entire surface regions of the loaded substrate panels substantially uniform and steady during the vapor deposition process. The downstream flow of remaining vapor material is guided over the peripheral edge of the heater plates 1600 before being partially removed out from the exit port 1145. The holes 1152 near a corner region of the lower portion 1150 of the shield structure are made slightly bigger than the holes 1151 located away from the corner region, which is a structural design allowing a substantially balanced downstream flow all around the peripheral side regions towards the exit port 1145. The as-formed steady interior gas flow plays important role to enhance uniformity of the film deposition on the substrate panels having a form factor as large as 165 cm×65 cm or greater. Disposing two 165 cm×65 cm substrate panels in a side-by-side configuration also help to make the total area of the heater plates 1600 to be near a square shape, with a reduced directional non-uniformity.

Figure 7:
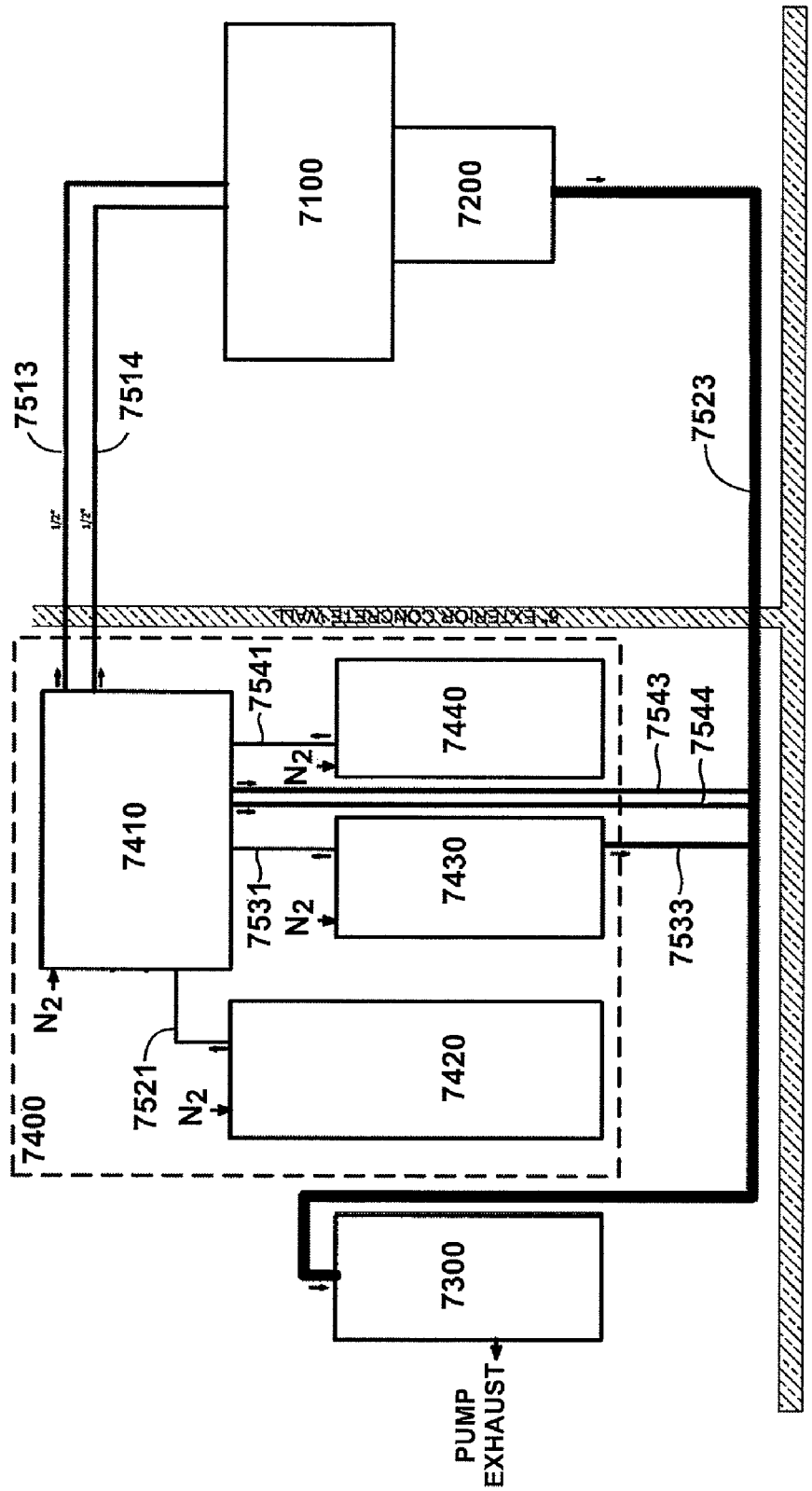
FIG. 7 is a simplified diagram illustrating a system for fabricating thin film photovoltaic devices.

FIG. 7 is a simplified diagram illustrating a system for fabricating thin film photovoltaic devices according to an embodiment of the present invention. This diagram is merely an example, which should not limit the scope of the claims herein. As shown, the system 7000 is a metal-organic chemical vapor deposition (MOCVD) system for fabricating one or more thin films for photovoltaic devices on substrate panels with various sizes from 20 cm×20 cm to as large as 65 cm×165 cm or other form factor. The system 7000 includes a MOCVD process module 7100, a valve stack module 7200, a vacuum pump module 7300, and a precursor subsystem 7400. The process module 7100 includes a mixing chamber and a deposition chamber. The mixing chamber is for receiving one or more vapor materials and mixing them to form a mixed vapor precursors. The mixing chamber directly coupled to the deposition chamber to deliver the precursors through a lid structure and deposit onto substrates loaded inside the deposition chamber. The deposition chamber can be maintained in a vacuum condition during the process by using the pump module 7300 connected by a 4-inch vacuum foreline 7523 and mediated by the vacuum valve stack module 7200 for monitor and regulation. The precursor subsystem 7400 includes a bubbler control module 7410, a plurality of delivery modules for supplying liquid materials for preparing the vapor precursors needed for thin film growth in deposition chamber. In a specific embodiment for fabricating a top electrode structure for thin film photovoltaic device based on copper indium diselenide material, a first delivery module 7440 is used for supplying DI water, a second delivery module 7430 is used for supplying diethylzinc (DEZ) liquid, and a third delivery module 7420 is for providing one or more types of doping materials. In particular, a doping material used in an implementation is diborane gas mixed with nitrogen gas.

Referring to FIG. 7, the bubbler control module 7410 is coupled to the process subsystem 7100 via two delivery pipelines 7513 and 7514 respectively for delivering two different vapor material(s). In a specific embodiment, a first vapor material is generated by a bubbler within the module 7410 from DI water supplied by the first delivery module 7440 through a pipeline 7541. The first delivery module 7440 needs a purge gas for inducing the delivery. In an embodiment, the purge gas uses typical inert gas like pure nitrogen. A second vapor material may be generated by a separate bubbler within the module 7410 from a second liquid supplied by the second delivery module 7430 through a pipeline 7531. In an implementation, the second liquid includes diethylzinc liquid. Similarly, the second delivery module 7430 also connects to a nitrogen gas source for inducing the liquid delivery. In a specific embodiment, the bubbler control module 7410 also includes one or more valves and pipe circuits for merging one or more gaseous material into the second vapor material. As shown, the gaseous material may be directly supplied from a third delivery module 7420 through a pipeline 7521 into the module 7410. In an implementation, the gaseous material is originated from a predetermined dopant gas species mixed with nitrogen gas and is delivered via a pressured nitrogen gas. In addition, the module 7410 has two vent pipelines 7543 and 7544 coupled to the vacuum foreline 7523, respectively for the venting of the two delivery pipelines 7513 and 7514. The second delivery module 7430 also has a vacuum vent line 7533 connected to the vacuum foreline 7523. The bubbler control module 7410 also uses a pressurized nitrogen process gas in the vapor generation and delivery process for the first vapor material and the second vapor material. Furthermore, a fluid pipe with running temperature-controlled fluid can be used to attach with each bubbler in the bubbler control module for maintaining a liquid box within a temperature range between about 15° C. to about 30° C. The hot fluid is supplied from and returned to a remote heat exchanger (not shown).

Figure 8A:
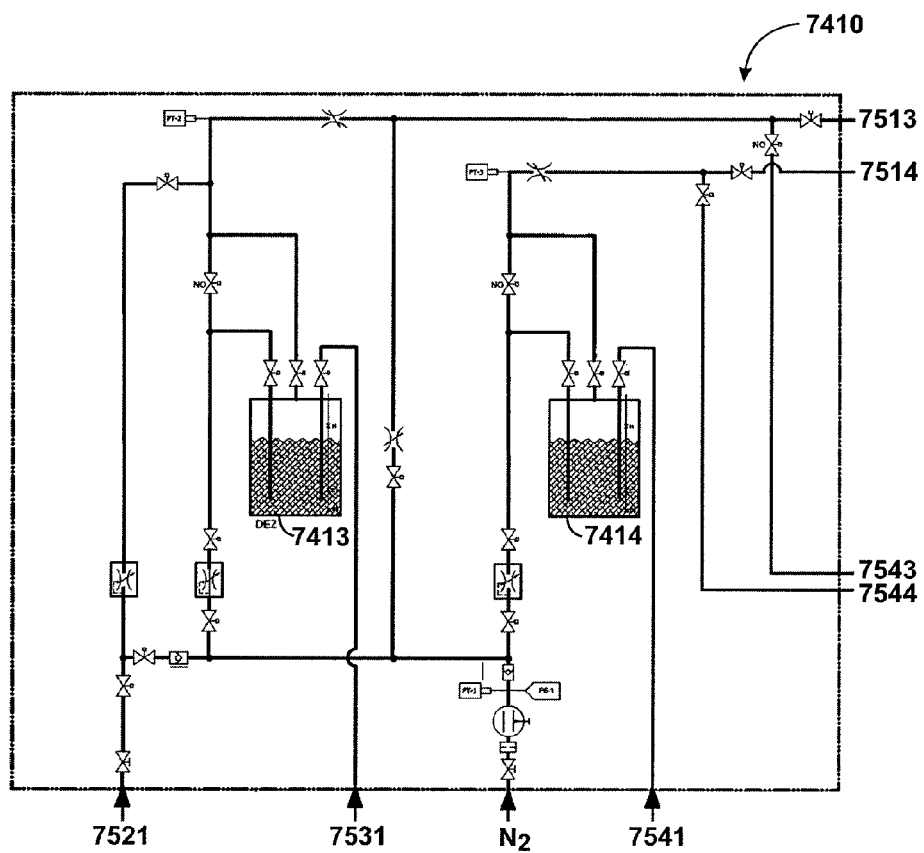
FIG. 8A shows a bubbler control module of the system for generating vapors from liquid chemicals according to an embodiment of the present invention.

FIG. 8A shows a bubbler control module of the system for generating bubbles from liquid chemicals according to an embodiment of the present invention. This diagram is merely an example, which should not limit the scope of the claims herein. As shown in a specific embodiment, the bubbler control module 7410 is a control box containing a water bubbler 7414 and a DEZ liquid bubbler 7413. The box has an approximate dimension of 50 inch (H)×22 inch (W)×16 inch (D) fabricated from steel and exhausted at 150 cfm using a 4-inch diameter duct. The water bubbler 7414 is configured to receive DI water with a dynamic pressure of about 5 psig from a first liquid inlet 7541. The DEZ liquid bubbler 7413 is set up similarly to receive DEZ liquid through a second liquid inlet 7531. A first gas inlet provides nitrogen process gas with 80 psig pressure 10 slm flowrate settings for inducing bubble generation and vapor delivery for both bubblers 7413 and 7414. The nitrogen gas is introduced through a valve and is filtered then regulated by N2 regulator set at 20±1 psig. A check valve is sequentially in the pipeline before sending the nitrogen process gas to split to either the water bubbler or DEZ liquid bubbler. The nitrogen process gas is further adjusted by a metering valve with a flow setting of about 5 slm before being directed (via one or more pneumatic valves) into each bubbler. The N2 process gas or the supplied liquid is fed through a bubbler box top using a ¼ inch bulkhead VCR connection and guided down to the bottom region of the stored liquid in the box. The gas or vapor outlets of the bubblers are fed through the box top using a ½-inch bulkhead VCR connection and connected to vapor delivery pipelines 7514 or 7513. Each bubbler 7413 or 7414 includes a combination of ultrasonic level sensor, continuous level measurement and two discrete high and low points at 75% and 25% full respectively.

Also shown in FIG. 8A, the vapor delivery pipelines 7514 and 7513, as shown, also respectively coupled to two vacuum vent lines 7544 and 7543. All vapor delivery pipeline is kept above 25° C. at all times and shall not exceed 50° C. Additionally, the bubbler control box 7410 includes a second gas inlet 7521 for delivering a gaseous material and controllably merging with the second vapor material generated by the DEZ bubbler. In an implementation, the gaseous material is a mixture of 0.75% diborane and nitrogen gas. A metering valve is employed to set the flow rate to about 2 slm before allowing the gaseous material to merge with the second vapor in the outlet pipeline 7513. Therefore, the actual vapor material outputted via a gas outlet of the bubbler control module into the delivery pipeline 7513 should be a third vapor material containing a mixture of both the second vapor and the gaseous material. In a specific embodiment, the third vapor material comprises at least DEZ vapor, nitrogen gas, and diborane gas.

Figure 8B:
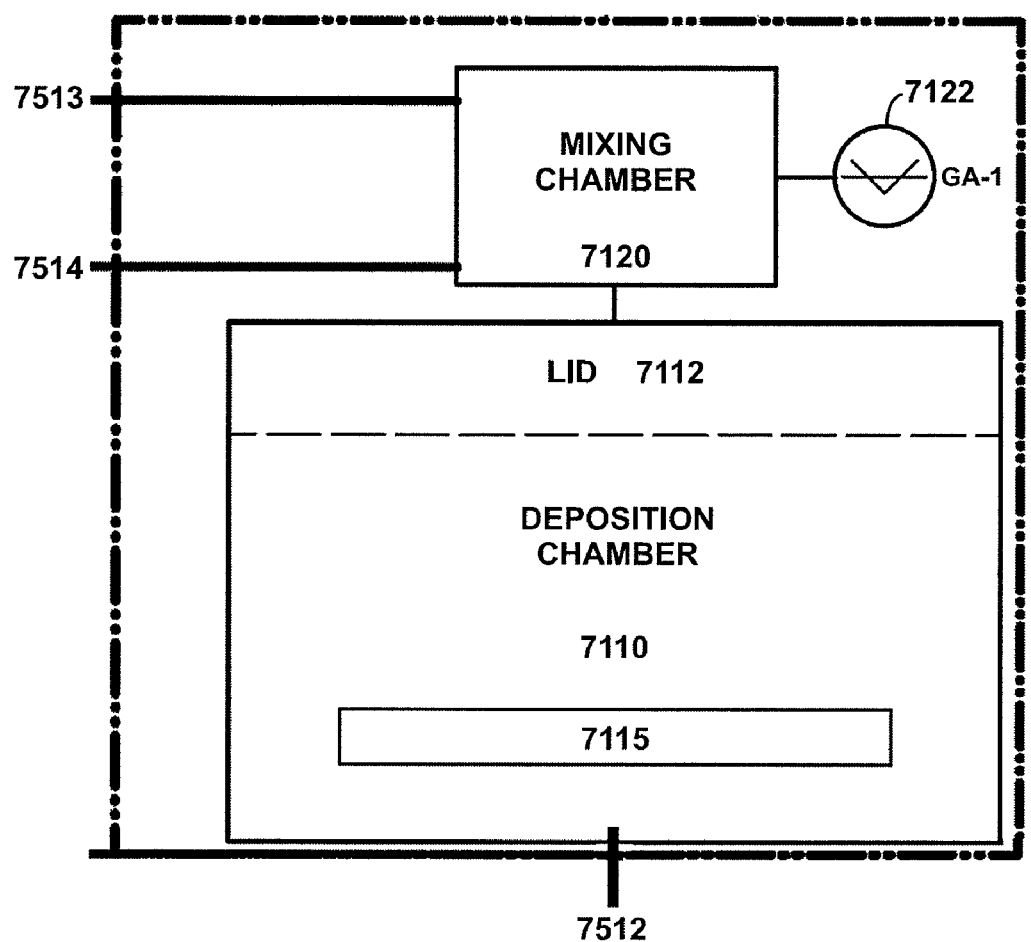
FIG. 8B shows a process module of the system.

FIG. 8B shows a process module of the system according to an embodiment of the present invention. This process module is substantially a simplified version of the apparatus 1000 shown in FIGS. 1 through 6. As shown, the process module 7100 includes a mixing chamber 7120 and a deposition chamber 7110 coupled to the mixing chamber through a lid structure 7112. The mixing chamber 7120 has two gas inlets which are respectively connected to two vapor delivery pipelines 7513 and 7514 (see FIG. 7 and FIG. 8). Within the mixing chamber, all the vapor materials received are mixed to form a mixed vapor precursor intended for processing chemical vapor deposition. The mixing and vapor delivery process is monitored directly by a pressure gauge 7122 connected via a ½ inch VCR connection. The vapor precursors formed in the mixing chamber 7120 then can be distributed downward through the lid structure 7112 into the deposition chamber 7110 to deposit onto one or more substrates 7115. In particular the distribution process via the lid structure is thermally controlled to maintain a desired temperature for the vapor precursor passed by and is configured to substantially uniformly diffuse the vapor precursor throughout all surface area of one or more substrates 7115 with dimensions ranging from 20 cm to 165 cm. The deposition chamber 7110 has a vacuum port 7512 capable of connecting a pump module (not shown).

Figure 8C:
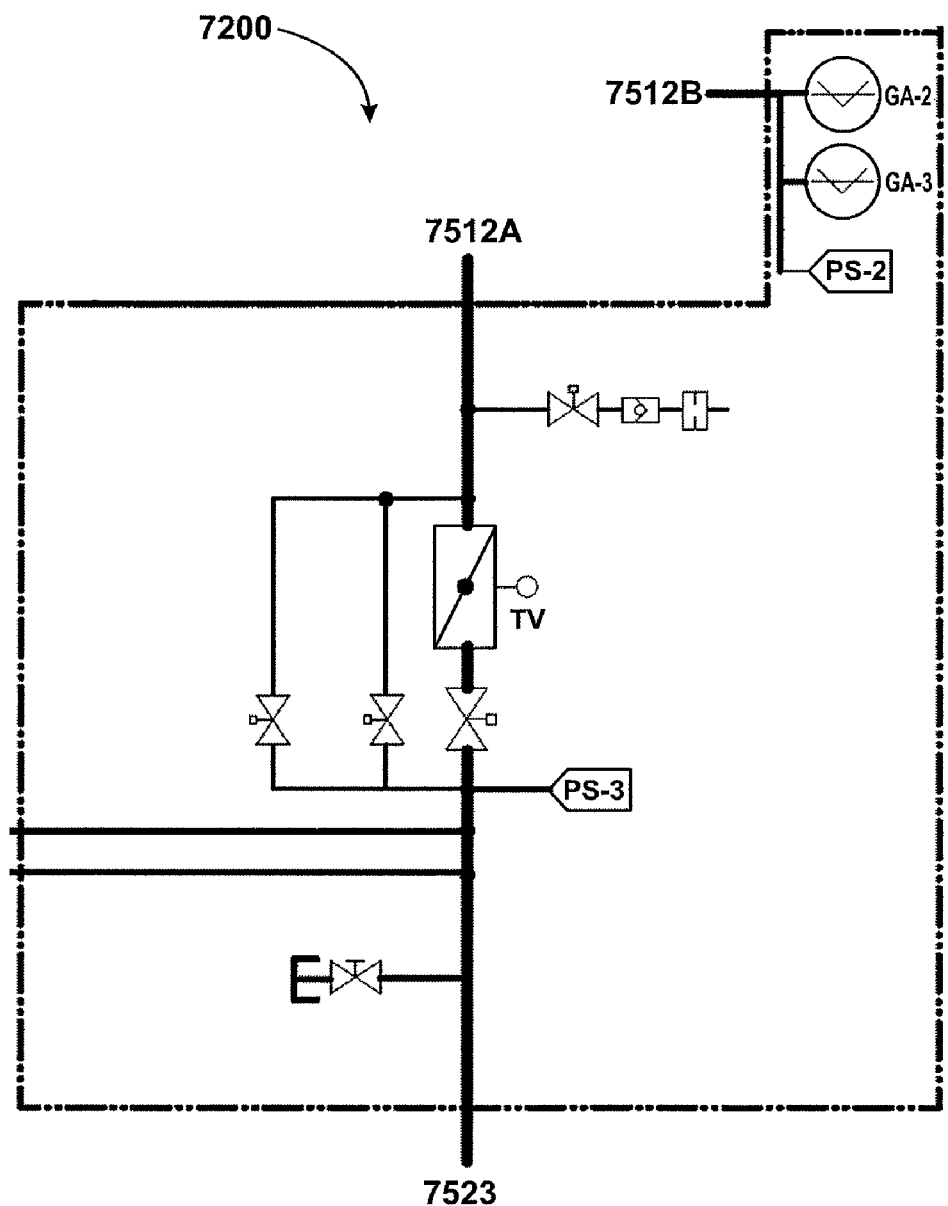
FIG. 8C shows a valve stack module of the system for controlling vacuum condition of the process module of FIG. 8B.

FIG. 8C shows a valve stack module of the system for controlling vacuum condition of the process module of FIG. 8B according to an embodiment of the present invention. This diagram is merely an example, which should not limit the scope of the claims herein. As shown, the valve stack module 7200 includes a monitor port 7512B for connecting one or more pressure gauge or pressure switch to measure and monitor chamber pressure and control a throttle valve. The valve stack module 7200 directly couples to the process module via a vacuum port 7512A which is the same port 7512 shown in FIG. 8B. Additionally, the valve stack module 7200 includes a combination of several mechanical valves including the throttle valve, a rough valve, a medium pump valve, a slow pump valve, and a pressure switch. Further along the vacuum foreline, there is also a leak check port with a manual valve connected between the pressure switch and the vacuum pipeline 7523 for connecting to a pump module.

Figure 9A:
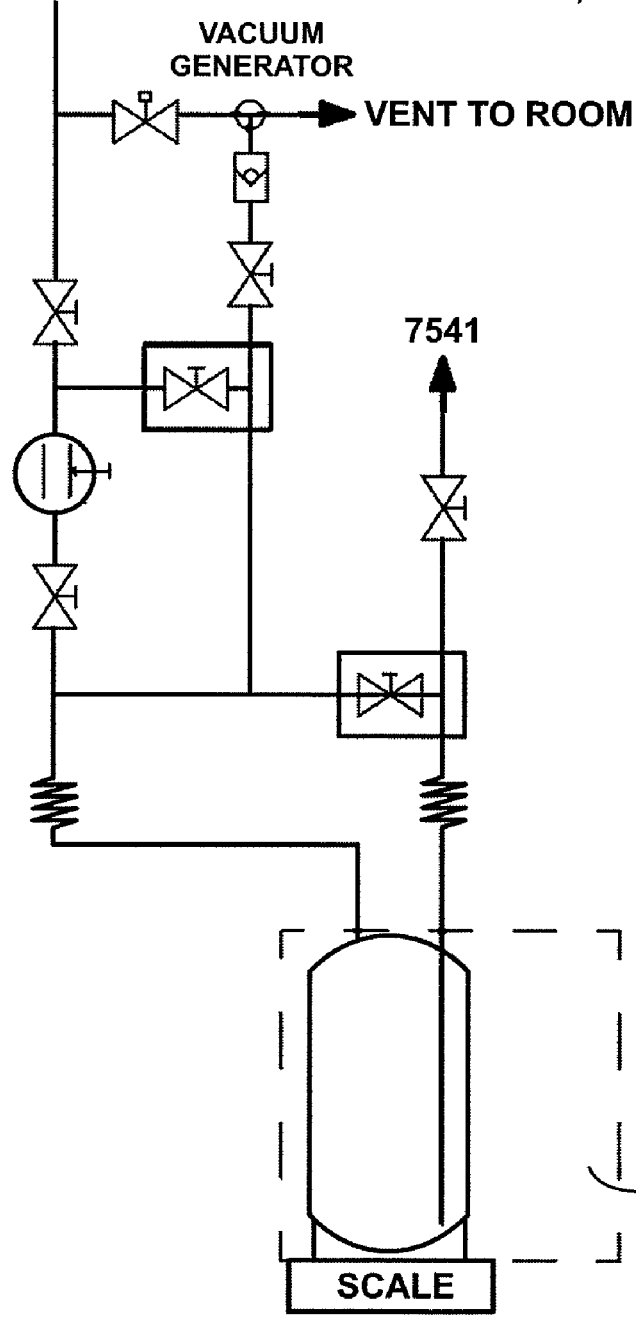
FIG. 9A shows a first delivery module for delivering a first liquid.

FIG. 9A shows a first delivery module for delivering a first liquid according to an embodiment of the present invention. This diagram is merely an example, which should not limit the scope of the claims herein. In a specific embodiment, the first delivery module 7440 is for supplying a first liquid, DI water in an implementation, to the first bubbler 7414. As shown, the module 7440 includes a purge gas inlet to draw nitrogen process gas through a combination of valves and regulators, a water tank 8440 capable of storing at least 5 gal of DI water, an outlet port connected to the first liquid inlet 7541 towards the bubbler control module 7410, and an alternate vent port for venting to room thereof. In an example, the process gas is set to a pressure of 80 psig with a flow rate of about 1.5 scfm. Before it is guided to the water tank, an $N_2$ regulator is added to set and lock the nitrogen process gas pressure at about 5 psig which is also the dynamic pressure for outgoing DI water flow towards the first bubbler.

Figure 9B:
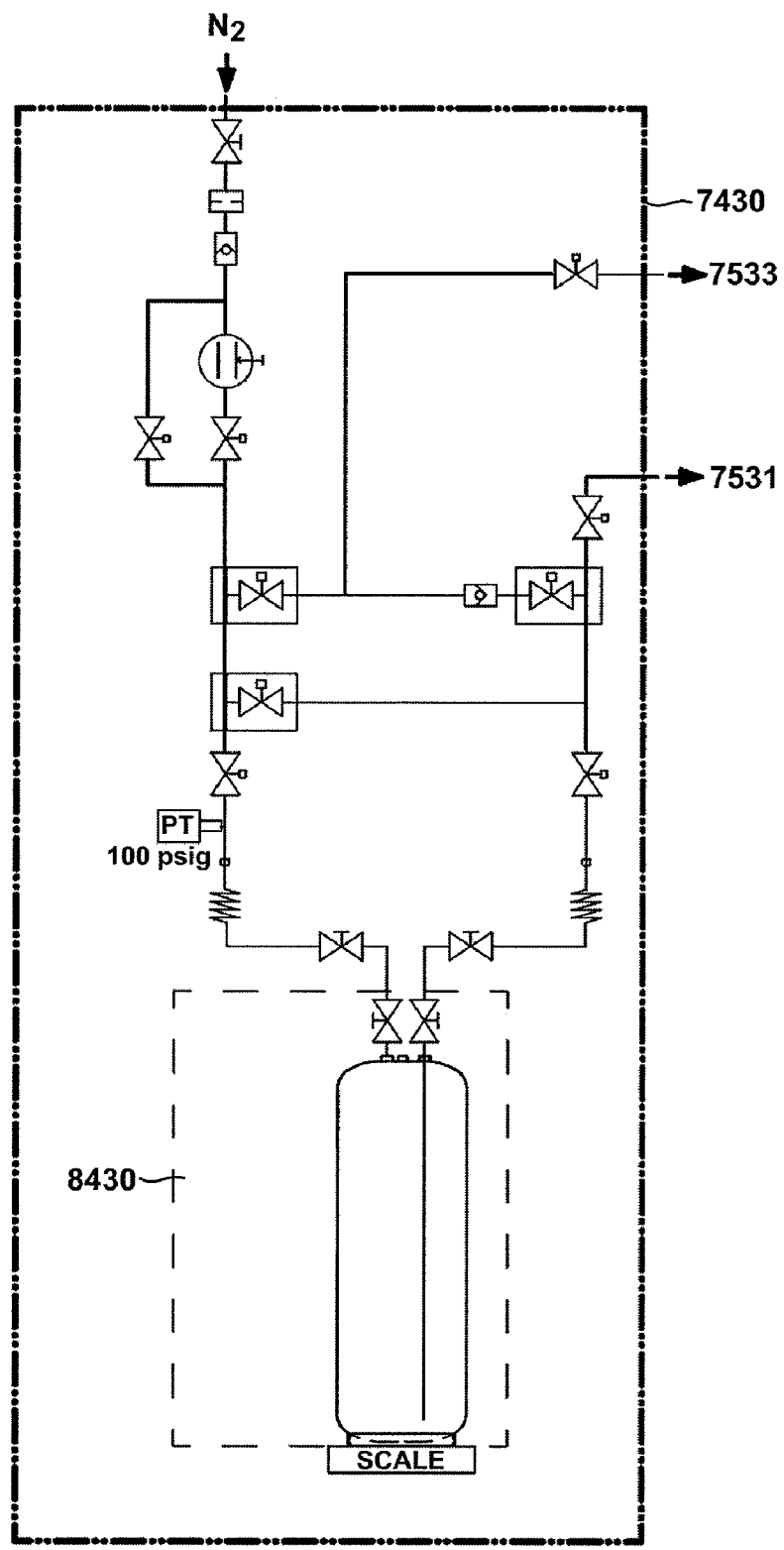
FIG. 9B shows a second delivery module for delivering a second liquid.

FIG. 9B shows a second delivery module for delivering a second liquid according to an embodiment of the present invention. This diagram is merely an example, which should not limit the scope of the claims herein. As shown, the second liquid to be delivered is DEZ liquid in a specific implementation for fabricating ZnO film on photovoltaic devices. The module 7430 is a separate box having a dimension of about 70×26×24 inches fabricated by steel, including a DEZ liquid tank, a combination of various valves, regulators, and pressure transducer, a vent port, an outlet for delivering the DEZ liquid, and a gas inlet. The gas inlet connects to a source of 80 psig pressurized nitrogen $N_2$ process gas with a 10 slm flow setting. The $N_2$ process gas is filtered and regulated by an $N_2$ regulator with a flow rate locked at 5 psig before being split and partially guided to help deliver the DEZ liquid. Partially the nitrogen $N_2$ process gas is guided through a pressure transducer set at 100 psig for pushing the DEZ liquid through the outlet to the second liquid inlet 7531 of the bubbler control module 7410. The vent port is connected to the vacuum pipeline 7523 for letting waste liquid vapor or nitrogen being pumped out.

Figure 9C:
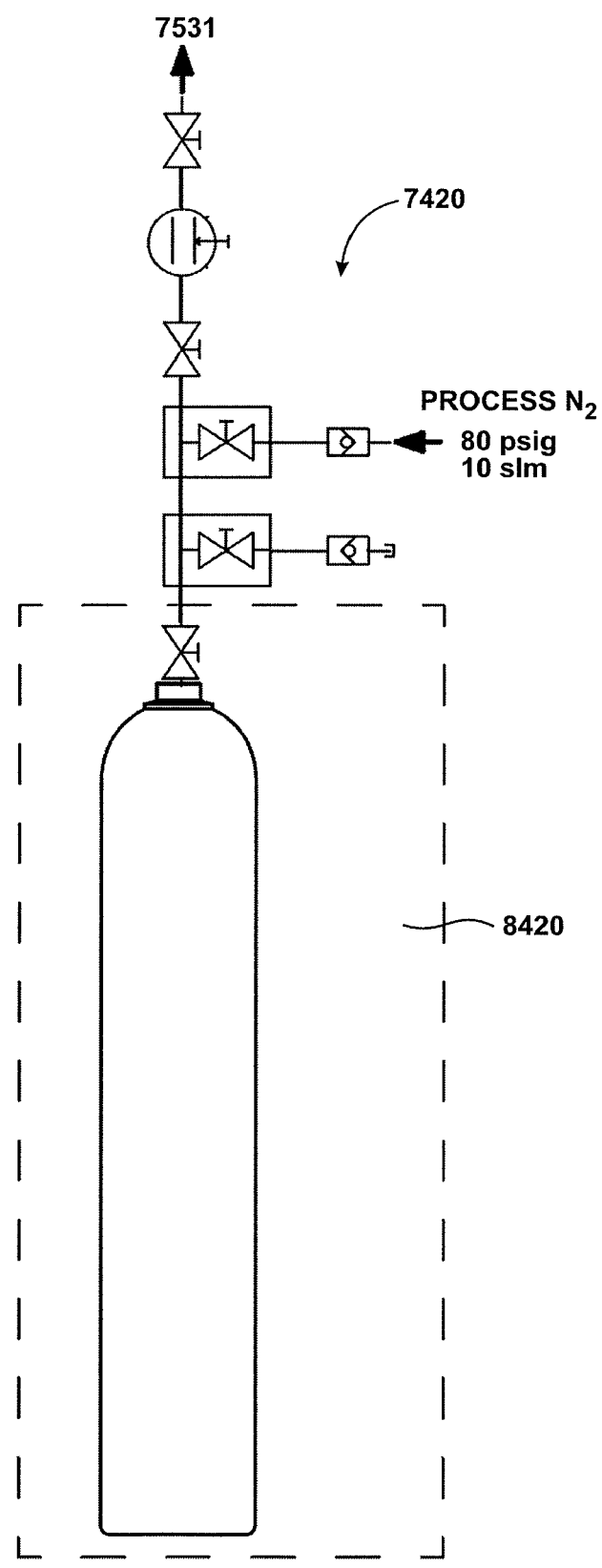
FIG. 9C shows a third delivery module for delivering a gaseous species.

FIG. 9C shows a third delivery module for delivering a gaseous species according to an embodiment of the present invention. This diagram is merely an example, which should not limit the scope of the claims herein. As shown, the module 7420 includes a storage gas bottle and manifold 8420, a gas inlet, and an outlet for delivering a gaseous species to the second gas inlet 7531 of the bubbler control module 7410. The gas inlet is directly connected to a source of 80 psig pressured nitrogen $N_2$ process gas with a 10 slm flow setting. The pressured $N_2$ process gas help to deliver the gas species coming out of the storage gas bottle 8420 and use a regulator to set the outflow rate at 5 psig.

Figure 10:
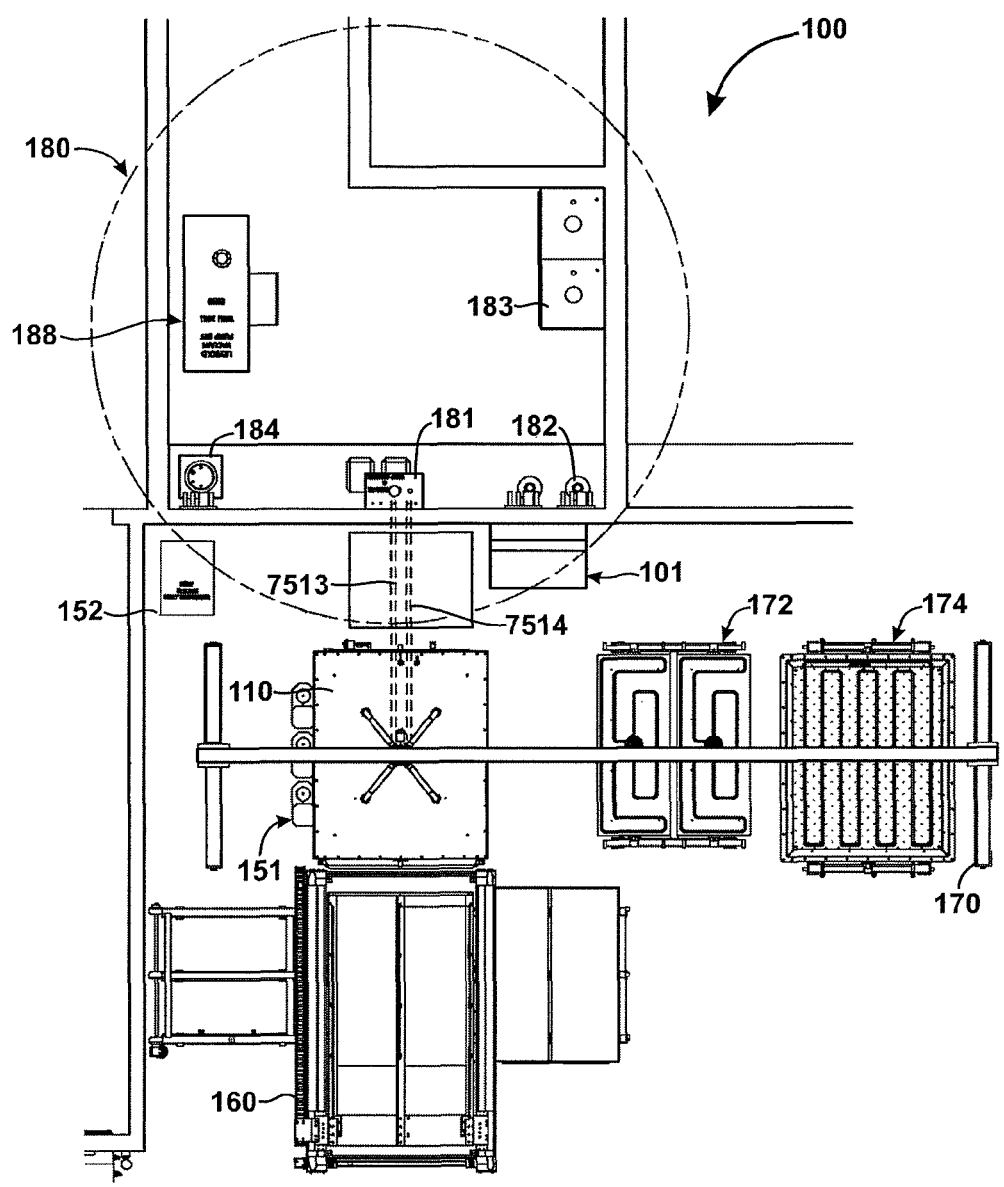
FIG. 10 shows a MOCVD system for manufacturing large scale thin film photovoltaic panels.

FIG. 10 is a top view of a MOCVD system for manufacturing large scale thin film photovoltaic panels according to an embodiment of the present invention. This diagram is merely an example, which should not limit the scope of the claims herein. As shown, the system 100 is a metal-organic chemical vapor deposition (MOCVD) system for fabricating conductive oxide films over thin film photovoltaic cells built on large substrate panels. In a specific embodiment, the thin film photovoltaic cell is based on copper indium diselenide thin film semiconductor absorber. To form top electrode film or window layer for completing the photovoltaic devices, this system is capable of depositing films over the substrates having dimensions ranging from 20 cm to 165 cm. In an embodiment, the system 100 is substantially the same as system 7000 shown in FIG. 7. In a specific embodiment, the system 100 includes a MOCVD process module 110 disposed in a room with a dual substrate loader 160 attached to a side having a door access to a deposition chamber. The system 100 also includes a subsystem 180 disposed in a separate room, including a pump module 188 and a vapor delivery control box 181, a water delivery module 184, a DEZ liquid delivery module 183, and a dopant gas supply module 182. The top part visible of the process module 110 reveals a lid of the deposition chamber coupled to four gas inlets from a mixing chamber (disposed over the deposition chamber but the view is partially blocked by an overhead crane structure). The mixing chamber is coupled through a pair of gas pipelines 7513 and 7514 for receiving two vapor materials delivered from the vapor delivery control box 181. The vapor materials are mixed within the mixing chamber to form a vapor precursor ready for delivering into the deposition chamber. One or more high temperature heat exchangers 151 are set to another side of the deposition chamber for providing hot oil running into the heating pipe embedded in the heater plate (not visible here) therein. Over the process module 110, there is a crane structure 170 set for maintenance services of the lid including a vapor diffuser plate or the heater plate and any associated parts. The crane structure 170 is high enough to lift the lid or the heater plate and configured to turn them around for the convenience of cleaning, repairing, and other maintenance works. In an example, FIG. 10 shows a heater plate 172 with dual heaters and a lid 174 attached with a diffuser plate respectively in their maintenance positions set by the crane structure 170.

In a specific embodiment, the system 100 also includes a control console 101 for the whole system and a diffuser heat exchanger 152 remotely disposed for providing temperature control running fluid for the diffuser plate associated with the lid.

It is understood that the examples and embodiments described herein are for illustrative purposes only and that various modifications or changes in light thereof will be understood by persons skilled in the art and are to be included within the spirit and purview of this application and scope of the appended claims. Although the above has been generally described in terms of a specific structure for CIS and/or CIGS thin film cells, other specific CIS and/or CIGS configurations can also be used, such as those noted in issued U.S. Pat. Nos. 4,611,091 and 4,612,411 without departing from the invention described by the claims herein.

What is claimed is:

1. An apparatus for fabricating thin film photovoltaic devices on substrate panels, the apparatus comprising:
 a deposition chamber enclosed by a plurality of sidewalls, a lid member structure, and a base member structure, the deposition chamber being supported by a support member structure;
 a mixing chamber disposed above the lid member structure and configured to receive two or more vapor species and form a mixed vapor, the mixing chamber being coupled with the deposition chamber via one or more inlets through the lid member structure;
 two heater plates disposed side-by-side and supported on the base member structure for respectively supporting and heating two substrate panels each having substantially the same geometric shape and surface area as each heater plate;

a lifting structure disposed under the deposition chamber and configured to lift the two substrate panels to a predetermined position inside the deposition chamber by using a plurality of pins to pass through both the base member structure and each of the two heater plates; and a valve stack coupled to the deposition chamber via an exit port located below the two heater plates in a central region of the base member structure, the valve stack communicating the deposition chamber with a pumping module through a vacuum foreline.

2. The apparatus of claim 1 wherein at least one of the plurality of sidewalls comprises a vacuum sealed door configured to slide down using an airflow actuator to open for loading/unloading the two substrates.

3. The apparatus of claim 1 wherein the lid member structure comprises a distributor plate respectively disposed under each of the one or more inlets and a diffuser plate disposed at a spatial distance below the distributor plate to form a cavity.

4. The apparatus of claim 3 wherein the distributor plate comprises a disk shape having four or more exit-holes disposed near its peripheral edge for allowing the mixed vapor from the one or more inlets to flow into the cavity.

5. The apparatus of claim 4 wherein each of the four or more exit-holes is configured to fit a gas diffusing element comprising a sink-filter body having a plurality of holes.

6. The apparatus of claim 4 wherein the diffuser plate comprises a plurality of showerhead holes for substantially uniformly delivering the mixed vapor from the cavity downward into the deposition chamber over the two substrate panels supported by the two heater plates.

7. The apparatus of claim 3 wherein the diffuser plate comprises a cooling channel with running fluid attached for controlling temperature of the mixed vapor and reducing temperature of diffuser plate to suppress chemical reaction and film growth thereon.

8. The apparatus of claim 1 wherein each of the two heater plates comprise an embedded structure that is substantially identical but laid in a mirror symmetrical configuration relative to a middle line between the two heater plates.

9. The apparatus of claim 8 wherein the embedded structure comprises a first heating element, a second heating element, and a plurality of through-holes.

10. The apparatus of claim 9 wherein the first heating element comprises a pipe configured to be filled with a first fluid and to have a path laid near edge regions within the heater plate and the second heating element comprises a pipe configured to be filled with a second fluid and to have a path laid near middle regions within each heater plate, the first fluid and the second fluid being supplied separately through a flow structure near a central region of the heater plate from a remote heat exchanger.

11. The apparatus of claim 9 wherein the plurality of through-holes are disposed to align respectively with the plurality of pins, allowing the plurality of pins at least partially pass through beyond the heater plate above the base member structure.

12. The apparatus of claim 1 wherein the base member structure includes a plurality of vacuum feedthroughs configured to respectively feed in the plurality of pins and used for supporting the two heater plates.

13. The apparatus of claim 1 wherein the lifting structure is directly coupled to one end of each of the plurality of pins and is suspended and lifted by air flows from one or more airflow actuators mounted on the support member structure.

14. The apparatus of claim 1 wherein the deposition chamber further comprises an interior shield structure assembled from a first part attached to cover the plurality of sidewalls, a second part curtained around an outer peripheral edge of the two heater plates to cover side regions between the two heater plate and the base member structure, a third part to cover a middle gap between the two heater plates, and a fourth part disposed below the two heater plates and above the base member structure to cover a bottom face of the two heater plates.

* * * * *